(12) United States Patent
Murakami (10) Patent No.: US 6,641,407 B2
(45) Date of Patent: Nov. 4, 2003

(54) CONDUCTOR INTERCONNECT STRUCTURE CONNECTING CIRCUIT BOARDS

(75) Inventor: Yoshinori Murakami, Tokyo (JP)

(73) Assignee: Nissan Motor Co., Ltd., Kanagawa-ken (JP)

(*) Notice: Subject to any disclaimer, the term of this patent is extended or adjusted under 35 U.S.C. 154(b) by 0 days.

(21) Appl. No.: 09/955,302

(22) Filed: Sep. 19, 2001

(65) Prior Publication Data

US 2002/0037656 A1 Mar. 28, 2002

(30) Foreign Application Priority Data

Sep. 19, 2000 (JP) .......................... 2000-282945

(51) Int. Cl.⁷ ............................... H01R 12/00
(52) U.S. Cl. ........................... 439/65; 439/74
(58) Field of Search ................. 439/65, 66, 74

(56) References Cited

U.S. PATENT DOCUMENTS 5,037,311 A * 8/1991 Frankeny et al. ........... 439/591

\* cited by examiner

*Primary Examiner*—Tho D. Ta
(74) *Attorney, Agent, or Firm*—McDermott, Will & Emery

(57) ABSTRACT

An interconnect structure has a plurality of planar interconnects (1, 2) mutually superposed with a prescribed distance therebetween and serving as interconnects between two circuit boards (A, B), each of the planar interconnects (1, 2) having at least two connection terminals (1A, 1B, 2A, 2B) at the circuit boards (1, 2). Rather than using rigid wire interconnects as done in the past to make interconnections, planar interconnects having relatively large surface areas are used to increase the line-to-line capacitance, thereby enhancing the filtering function that reduces high-frequency noise.

19 Claims, 9 Drawing Sheets

DISTANCE BETWEEN TERMINALS/DISTANCE BETWEEN CIRCUIT BOARDS

—○— CONFIGURATION OF FIG.1
—□— PAST CONFIGURATION
—●— CONFIGURATION OF FIG.3
—■— ROUND-TRIP PATH WITH CROSSING

CONDUCTOR INTERCONNECT STRUCTURE CONNECTING CIRCUIT BOARDS

BACKGROUND OF THE INVENTION

The present invention relates to an interconnect structure making connection, for example, between circuit boards.

An electrical circuit is sometimes implemented using a two-layer circuit board structure. In such a structure, interconnection between the lower level and the upper level of the circuit has been achieved by using stiff wires, with a row of mutually parallel interconnections disposed on one side of a circuit board.

SUMMARY OF THE INVENTION

In the above-noted structure, however, because there is a large partial inductance in the interconnection part, if an attempt is made to pass a large current, there is a possibility of signal delay and waveform deterioration occurring. Unless the optimum circuit interconnection placement is achieved within the circuitry of the lower-layer and the upper-layer circuit boards, the need could arise to achieve crossing of lines in a circuit board, thereby resulting in an increase in the size of the circuit boards or an increase in the impedance of the interconnections. Another problem with the structure of the past is a lack of protection against the induction of externally introduced noise, and faulty operation occurring when operating in a strong electromagnetic field. Additionally, there was the problem of electromagnetic noise generated from the interconnections.

Accordingly, it is an object of the present invention to solve the above-described problems associated with related art, by providing a conductor structure making interconnection between two circuit boards, which facilitates connections between the two boards and suppresses the generation of electromagnetic noise.

In order to achieve the above-noted object, the present invention adopts a technical constitution as specifically recited in the attached claims.

According to an aspect of the present invention, an interconnect structure comprises: a first interconnect comprising a body portion configured as a first planer conductor with a first plane, in a four-sided form having a first side, a second side, a third side opposing the first side, and a fourth side, the first side crossing the second side, with a first vertex therebetween, the third side crossing the second side, with a second vertex therebetween, a first connecting portion configured on the first side, in a vicinity of the first vertex, and a second connecting portion configured on the third side, in a vicinity of the second vertex; and a second interconnect comprising a body portion configured as a second planer conductor with a second plane close and parallel to the first plane, in a four-sided form having a fifth side, a sixth side parallel to the second side, a seventh side opposing the fifth side, and an eighth side, the fifth side crossing the eighth side, with a third vertex therebetween, the seventh side crossing the eighth side, with a fourth vertex therebetween, a third connecting portion configured on the fifth side, in a vicinity of the third vertex, and a fourth connecting portion configured on the seventh side, in a vicinity of the fourth vertex.

According to another aspect of the present invention, an interconnect structure comprises: a first interconnect comprising a body portion configured as a first planer conductor with a first plane, in a four-sided form having a first side, a second side, a third side opposing the first side, and a fourth side, the first side crossing the fourth side, with a first vertex therebetween, the third side crossing the second side, with a second vertex therebetween, a first connecting portion configured on the first side, in a vicinity of the first vertex, and a second connecting portion configured on the third side, in a vicinity of the second vertex; and a second interconnect comprising a body portion configured as a second planer conductor with a second plane close and parallel to the first plane, in a four-sided form having a fifth side, a sixth side parallel to the second side, a seventh side opposing the fifth side, and an eighth side, the fifth side crossing the sixth side, with a third vertex therebetween, the seventh side crossing the eighth side, with a fourth vertex therebetween, a third connecting portion configured on the fifth side, in a vicinity of the third vertex, and a fourth connecting portion configured on the seventh side, in a vicinity of the fourth vertex.

According to yet another aspect of the present invention, an interconnect structure comprises a plurality of layered interconnects having mutually flush sides, the plurality of layered interconnects each respectively comprising: a body portion configured as a planer conductor with a pair of planes, in a four-sided form including a pair of opposing sides; and a pair of connecting portions configured either on both of the pair of opposing sides.

BRIEF DESCRIPTION OF THE DRAWING

The above and other features will be better understood from the exemplary embodiments described below, taken together with the drawings, in which.

DETAILED DESCRIPTION OF THE PREFERRED EMBODIMENTS

Preferred embodiments of the present invention are described in detail below, with references made to relevant accompanying drawings.

Figure 1:
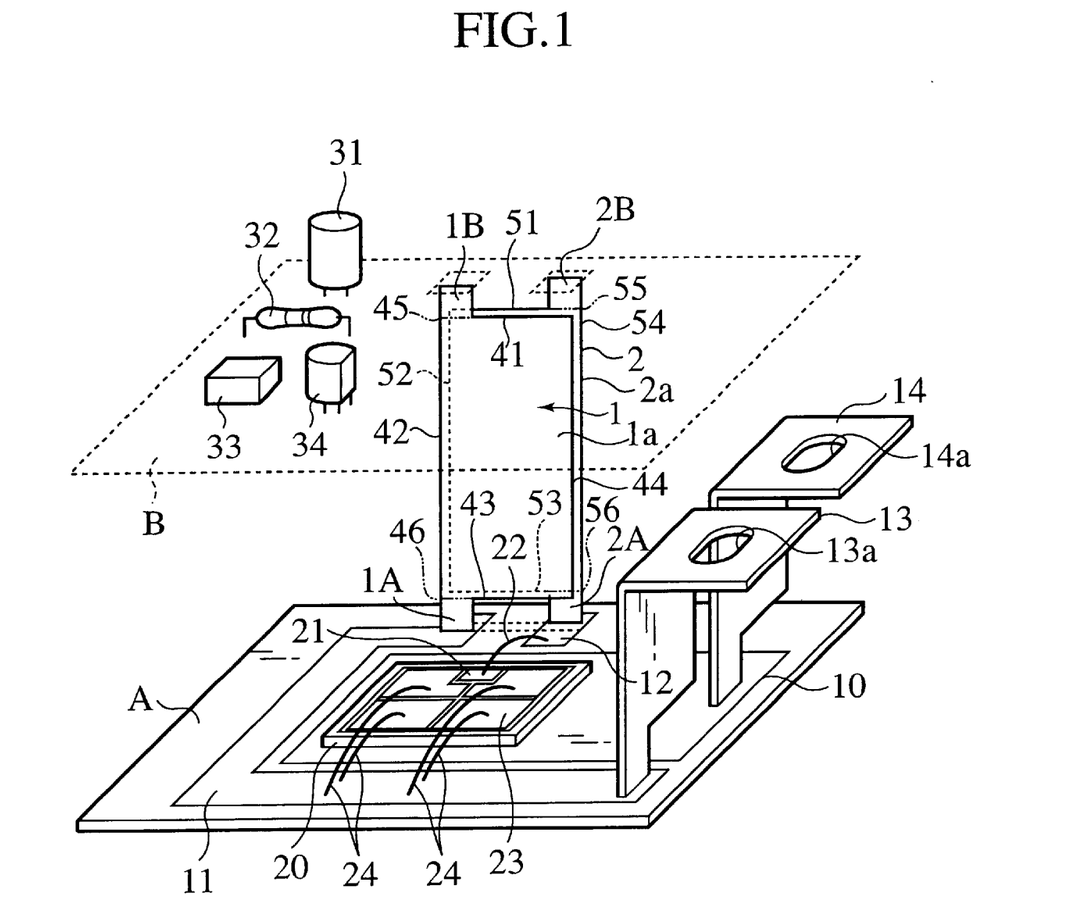
FIG. 1 is a perspective view of an embodiment of the present invention.

FIG. 1 is a perspective view showing a first embodiment of the present invention. In this drawing, the reference numerals 1 and 2 denote planar interconnects for implementing the present invention, and A and B are circuit boards, which are disposed in mutually parallel opposition. Connection terminals 1A and 1B for making connection to prescribed interconnections on circuit boards A and B are located at both ends of the planar interconnect 1, and similarly connection terminals 2A and 2B are located at both ends of the planar interconnect 2. The planar interconnects 1 and 2 are, for example, made of a copper sheet having a thickness of 0.2 mm, and are disposed with a very small spacing therebetween, for example approximately 0.2 mm. It will be understood that it is alternately possible to have an insulation film maintaining insulation and this spacing between the planar interconnects. It should be noted that FIG. 1 is a perspective view and, in order to make the positions of the planar interconnects clearly visible, they are drawn intentionally with a shift therebetween. This comment applies to other drawings to be used in subsequent descriptions to follow. Mounting is facilitated by making the widths of the connection terminals small in order to make connections to the circuit boards, and so that there is no mutual interference therebetween.

In other words, in FIG. 1, an interconnect structure comprises: a first interconnect 1 which comprises a body portion 1a configured as a first planer conductor with a first plane (the front side), in a four-sided form that has a top first side 41, a left second side 42, a bottom third side 43 opposing the first side 41, and a right fourth side 44, the first side 41 crossing the second side 42, with a left upper first vertex 45 therebetween, the third side 43 crossing the second side 42, with a left lower second vertex 46 therebetween, an upward first connecting portion 1B configured on the first side 41, in a vicinity of the first vertex 45, and a downward second connecting portion 1A configured on the third side 43, in a vicinity of the second vertex 46; and a second interconnect 2 which comprises a body portion 2a configured as a second planer conductor with a second plane (the rear side) close and parallel to the first plane of the first interconnect 1, in a four-sided form that has a top top fifth side 51, a left sixth side 52 parallel to the second side 42, a bottom seventh side 53 opposing the fifth side 51, and a right eighth side 54, the fifth 52 side crossing the eighth side 54, with a right upper third vertex 55 therebetween, the seventh side 53 crossing the eighth side 54, with a right lower fourth vertex 56 therebetween, an upward third connecting portion 2B configured on the fifth side 51, in a vicinity of the third vertex 55, and a downward fourth connecting portion 2A configured on the seventh side 53, in a vicinity of the fourth vertex 56.

In the embodiment described, the circuit board A has mounted thereon, for example: a central wide planer drain line 10 connected at its right end to a lower end of a vertical terminal 14 formed with a fixing hole 14a for external connection at the top; a long planer source line 11 connected at a rear end thereof to the lower terminal 1A of the planer interconnect 1, and at the right end to a lower end of another vertical terminal 13 formed with a fixing hole 13a for external connection at the top; a short planer gate line 12 connected on a rear half thereof to the lower terminal 2A of the planer interconnect 2; and a semiconductor chip 20 as a set of power supply MOS transistors having, on the upside, a gate electrode 21 connected by a bonding wire 22 to a front half of the gate line 12 and source electrodes 23 connected by bonding wires 24 to a front part of the source line 11, and at the downside, a drain electrode connected to the drain line 10.

The circuit board B has mounted thereon, for example, a capacitor 31, a resistor 32, a coil 33, and a transistor 34.

By adopting the above-described configuration, compared with the configuration in the related art, a first advantage that can be cited is an increase in the line-to-line capacitance between planar interconnects, so that the interconnects themselves serve as a filter to absorb high-frequency noise, thereby enabling a reduction in the high-frequency noise included in a signal.

Figure 3:
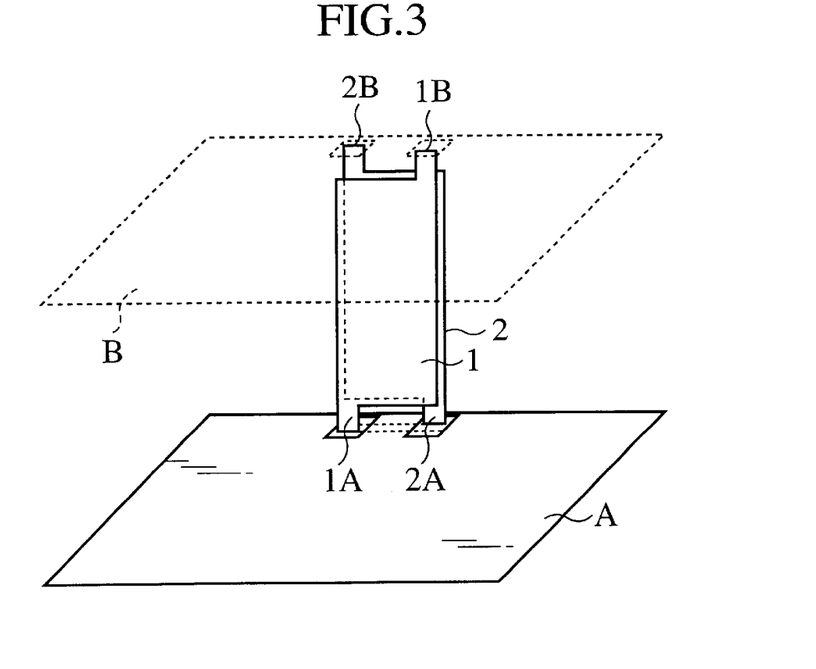
FIG. 3 is a perspective view showing another embodiment of the present invention.

Referring to FIG. 3, we see an example of an invention, in which the positions of the connection terminals on the circuit board B side of FIG. 1 have been reversed. Specifically, this has the effect of making currents flowing between the upper and the lower circuit boards cross as they flow through the planar interconnects. In the interconnect structure of the past, in order to achieve such a crossing of currents it was absolutely necessary either to carefully place rigid wire interconnects so as to impart a twist thereto, to use a jumper wire on a circuit board, to use a multiple-layer circuit board, or to make a major diversion of interconnects. Using the present invention, however, the achievement of this crossing of currents requires absolutely no technical difficulty with regard to structure.

In other words, in FIG. 3, an interconnect structure comprises: a first interconnect 1 which comprises a body portion configured as a first planer conductor with a first plane (the front side), in a four-sided form that has a top first side, a left second side, a bottom third side opposing the first side, and a right fourth side, the first side crossing the fourth side, with a right upper first vertex therebetween, the third side crossing the second side, with a left lower second vertex therebetween, a first connecting portion 1B configured on the first side, in a vicinity of the first vertex, and a second connecting portion 1A configured on the third side, in a vicinity of the second vertex; and a second interconnect 2 which comprises a body portion configured as a second planer conductor with a second plane (the rear side) close and parallel to the first plane, in a four-sided form that has a top fifth side, a left sixth side parallel to the second side of the first interconnect 1, a bottom seventh side opposing the fifth side, and a right eighth side, the fifth side crossing the sixth side, with a left upper third vertex therebetween, the seventh side crossing the eighth side, with a right lower fourth vertex therebetween, an upward third connecting portion 2B configured on the fifth side, in a vicinity of the third vertex, and a downward fourth connecting portion 2A configured on the seventh side, in a vicinity of the fourth vertex.

Additionally, by enabling simple achievement of current crossing by virtue of the interconnect structure, it is possible to eliminate the work involved in achieving crossing, which had in the past been done on the circuit board, thereby simplifying circuit board construction and saving surface area thereon. With this configuration, in particular in the case in which currents having the same amplitude are caused to flow in the planar interconnects 1 and 2 in mutually opposite directions, it is possible to achieve a significant reduction in interconnect inductance compared with the interconnect structure of the past, and this fact has been well known.

Figure 2:
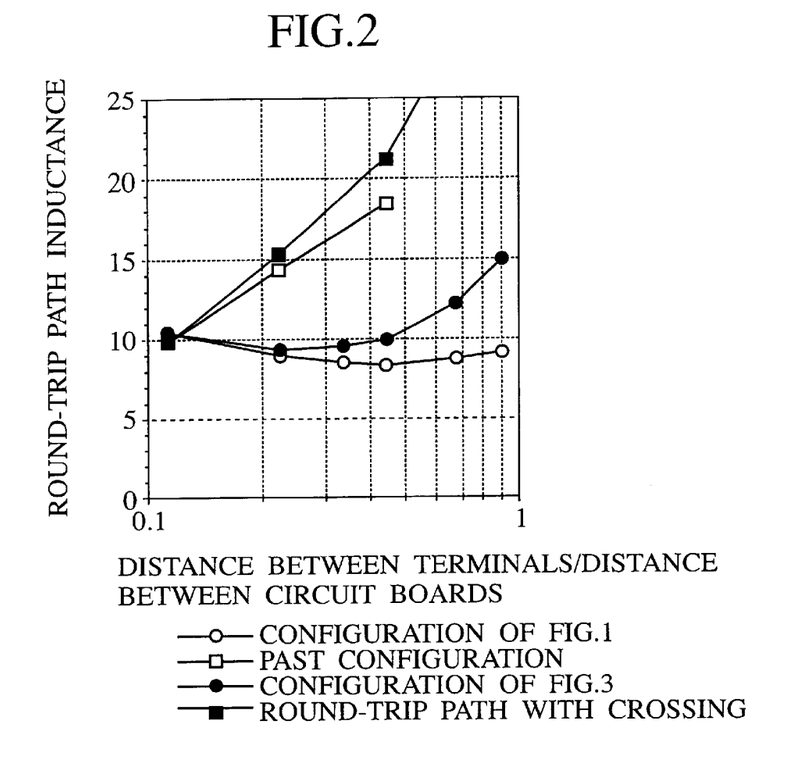
FIG. 2 is a graph showing the inductance characteristics of the present invention and prior art.

FIG. 2 is a graph showing the results of calculating the size of the interconnect partial inductance alone, in the prior art and in the present invention. The horizontal axis represents the distance between connection terminals, normalized with respect to the distance between two circuit boards. In FIG. 2, the white circles show the case of the present invention as illustrated by the example of FIG. 1, the black circles show the case of the present invention as illustrated by the example of FIG. 3, white squares show the prior art, and the black squares show the case of a round-trip path with crossing as used in the past.

As shown in FIG. 2, with the structure of the past, the farther away are the two interconnects, the greater is the partial inductance of the interconnect structure. In contrast to this, with the present invention, the inductance becomes smaller with increasing distance between the connection terminals, within the range shown on this graph, thereby providing an enhanced degree of freedom in routing of connections on the circuit board. The characteristics in the case of FIG. 3, in which there is crossing of interconnects, are also shown, and it can be seen that, compared to the case in which the connection terminal positioning is parallel, such as in FIG. 1, while there is somewhat of an increase in the inductance, it generally exhibits the same trend, the inductance being smaller than in the past in this case as well.

Figure 4:
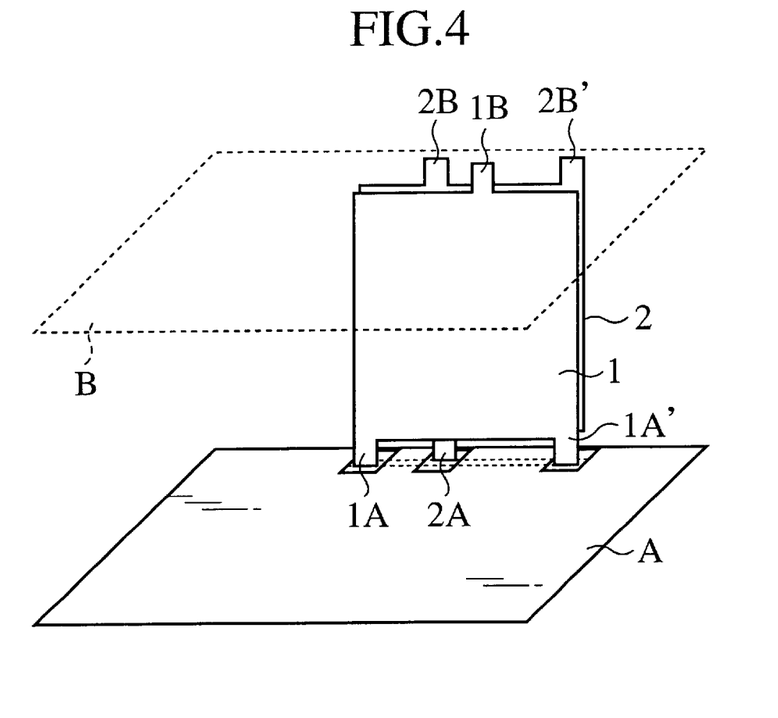
FIG. 4 is a perspective view showing yet another embodiment of the present invention.

As shown in FIG. 4, an alternate configuration of the present invention is one in which a plurality of connection terminals are provided on one end or both ends of one planar interconnect. In this case, the connection terminals 1A and 1A' serve also as a jumper wire on the circuit board A of the first-level circuit board A, without relationship to the connection terminal 1B. By doing this, the circuitry within the circuit board A is simplified, thereby enabling effective use of the circuit board surface area. By bringing the planar interconnect 1 and the planar interconnect 2 close together, the line-to-line capacitance therebetween increases, thereby enabling the interconnect structure to function as a noise filter. To achieve that purpose, it is effective to interpose a material having a high dielectric coefficient between the planar interconnects 1 and 2, unrelated to the purpose of achieving insulation therebetween.

In other words, in FIG. 4, an interconnect structure of FIG. 1 or FIG. 3 further comprises a fifth connecting portion 1A' or 2B' configured on one of the first side, the third side, the fifth side, and the seventh side.

Figure 5:
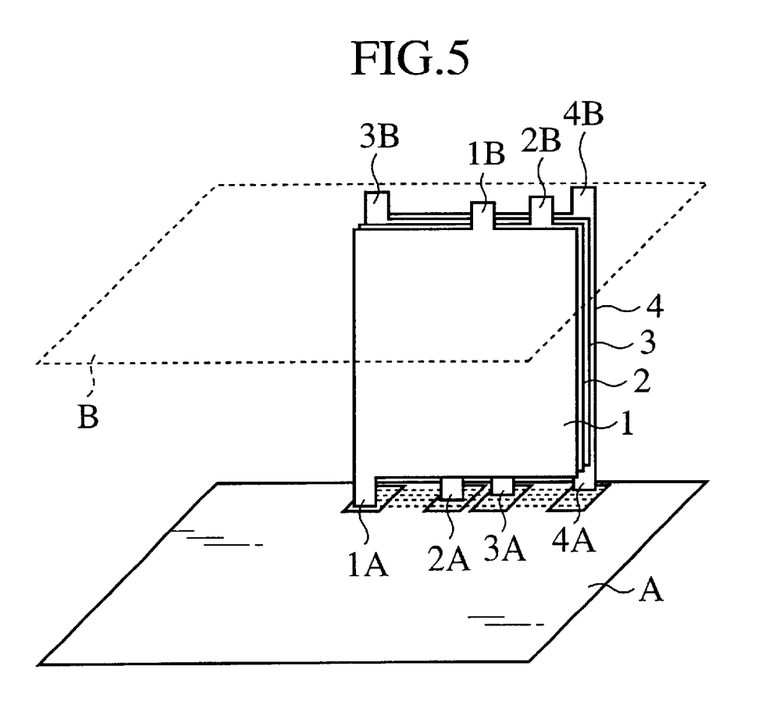
FIG. 5 is a perspective view showing yet another embodiment of the present invention.

FIG. 5 shows the use of four planar interconnects as an example of yet another embodiment of the present invention. In this drawing, the reference numerals 1, 2, 3, and 4 each represent planar interconnects. By adopting the interconnect structure of the present invention, as shown by the layout of the connection terminals on these planar interconnects, it is possible to arbitrary establish connections between the circuit boards, and the sequence of the connection terminals can also be arbitrarily established in this manner.

In other words, in FIG. 5, an interconnect structure comprises an arbitrary combination of interconnects shown in FIG. 1, FIG. 3, and/or FIG. 4. There may be included an interconnect structure comprising that of FIG. 1, and a third interconnect 3 which comprises a body portion configured as a third planer conductor with a third plane close and parallel to one of the first and second planes, in a four-sided form having a ninth side, a tenth side parallel to the second side, an eleventh side opposing the ninth side, and a twelfth side, the ninth side crossing the tenth side, with a fifth vertex therebetween, the eleventh side crossing the twelfth side, with a sixth vertex therebetween, a fifth connecting portion 3B configured on the ninth side, in a vicinity of the fifth vertex, and a sixth connecting portion 3A configured on the eleventh side, in a vicinity of the sixth vertex. Or there may be included an interconnect structure comprising that of FIG. 3 and a fourth interconnect 4 which comprises a body portion configured as a fourth planer conductor with a third plane close and parallel to one of the first and second planes, in a four-sided form having a ninth side, a tenth side parallel to the second side, an eleventh side opposing the ninth side, and a twelfth side, the ninth side crossing the twelfth side, with a fifth vertex therebetween, the eleventh side crossing the twelfth side, with a sixth vertex therebetween, a fifth connecting portion 4B configured on the ninth side, in a vicinity of the fifth vertex, and a sixth connecting portion 4A configured on the eleventh side, in a vicinity of the sixth vertex.

Figure 6:
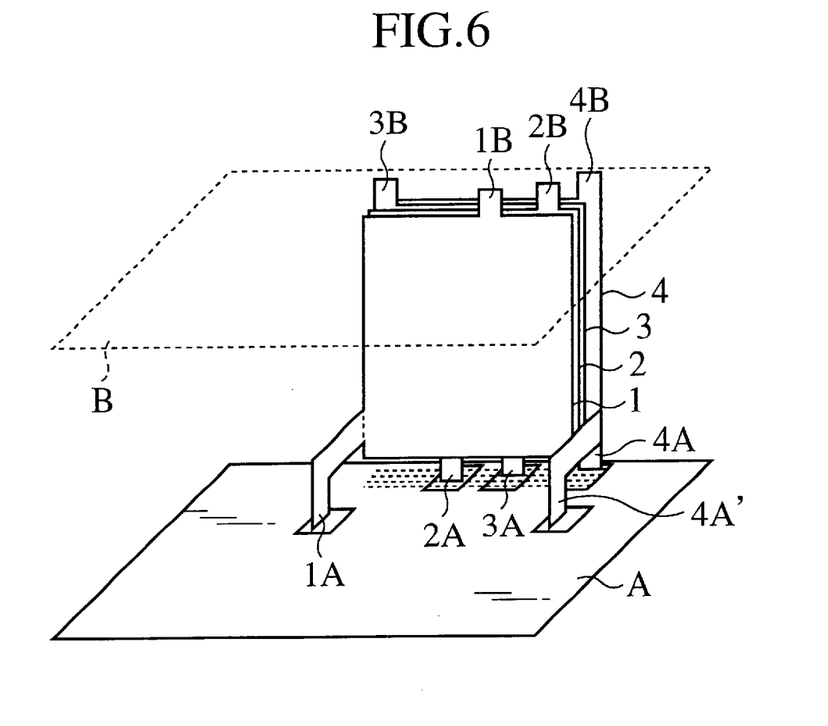
FIG. 6 is a perspective view showing yet another embodiment of the present invention.

Although the connection terminals shown in the foregoing cited drawings are disposed on opposing sides of a rectangular planar interconnect, it will be understood that this is not an intrinsic feature of the present invention. For example, it is possible to adopt an arrangement as shown in FIG. 6. Specifically, in the case of FIG. 6 the connection terminals 1A and 4A' extend outward at a prescribed angle from each planar interconnect side (the planar interconnect in this case being vertical), and make connections at positions that are at a distance from the main part of the planar interconnect. By adopting this type of arrangement, it is possible to establish an independently supported structure as the planar interconnect, and to simplify the mounting process.

In other words, in FIG. 6, an interconnect structure of any of FIG. 1 to FIG. 5 further comprises another connecting portion 1A or 4A' configured on one of the second side and the fourth side.

Figure 7:
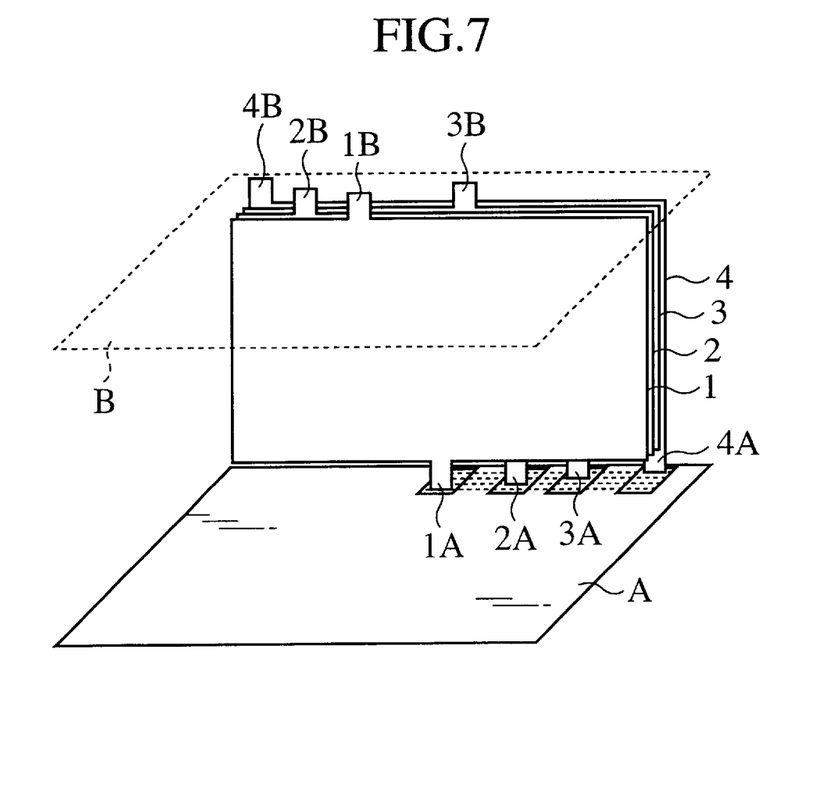
FIG. 7 is a perspective view showing yet another embodiment of the present invention.

As shown in FIG. 7, effective application of the present invention can be made even in the case in which there is an offset between the connection parts at the upper and lower circuit boards. By applying the present invention in this case, with the signal currents flowing at an inclination, the inductance is lower than the case in which the signal lines are routed on one of the circuit boards.

In FIG. 5 and FIG. 7, in the case in which the planar interconnects 1 and 3 are both connected to a ground line, and a signal line is connected to the planar interconnect 2, not only is this signal line is protected from externally introduced electromagnetic noise, but also external leakage of electromagnetic noise from the signal line itself is suppressed. It will be understood that that it is also possible to ground the planar interconnects 1 and 4. The connection destination of these two planar interconnects can be a power supply line, or a loading having a large impedance. This configuration is effectively usable in a so-called intelligent power module (IPM), in which a drive circuit is built into a power transistor module. In the case of an IPM, a power device is mounted on the circuit board A of FIG. 5, and each time a large current is switched, a high-intensity electromagnetic field is radiated to the surroundings. The effect of this extends to connects such as this, and can result in unexpected affects on the operation of the module. By using the present invention, however, it is possible to eliminate this influence.

While the foregoing drawings show the planar interconnects as rectangular, It will be readily understood that there is no restriction with regard to shape, as long as it is possible to make interconnections between connection terminals. However, if the purpose is to increase the line-to-line capacitance so as to achieve a high-frequency noise filtering effect, it is better to have an arrangement in which the area of superposition between the planar interconnects is large. Additionally, it will be understood that that the planar interconnects are not restricted to flat planar shapes, and can alternatively be, for example, a shape formed by truncating a cylindrical shape with a plane parallel to the center axis of the cylinder.

In other words, according to a generic aspect implemented in FIG. 7, an interconnect structure comprises a plurality of layered interconnects 1, 2, 3, and 4 having mutually flush sides (the above-noted second sides), the plurality of layered interconnects each respectively comprising a body portion configured as a planer conductor with a pair of planes, in a four-sided form including a pair of opposing sides, and a pair of connecting portions 1A, 1B; 2A, 2B; 3A, 3B; or 4A, 4B configured either on both of the pair of opposing sides. The plurality of layered interconnects may include any and all interconnects shown in FIG. 1 to FIG. 6.

Figure 8:
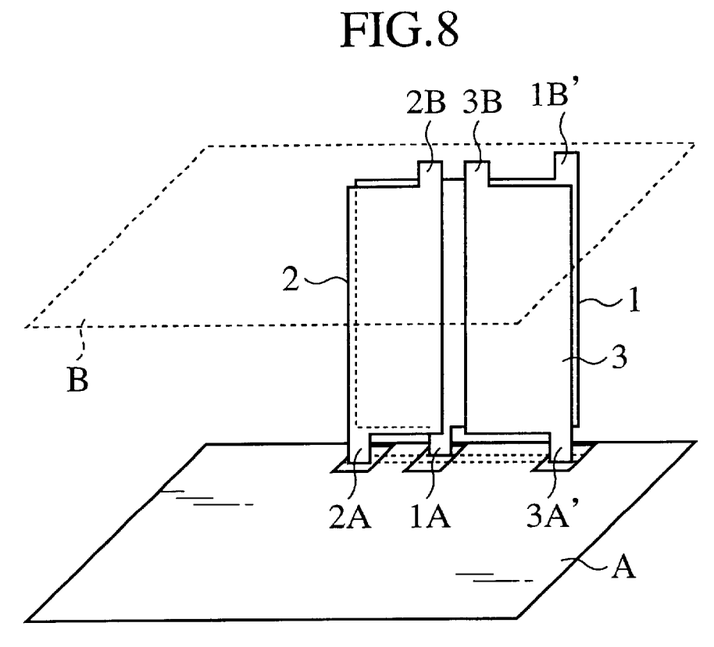
FIG. 8 is a perspective view showing yet another embodiment of the present invention.

FIG. 8 is a perspective view showing yet another embodiment of the present invention. In a case, for example, in which crossing of currents does not occur between the planar interconnects 2 and 3 in the embodiment shown in FIG. 5, it is possible as shown in FIG. 8 to form both on one and the same plane, thereby enabling savings in thickness of the overall interconnect structure.

Figure 9:
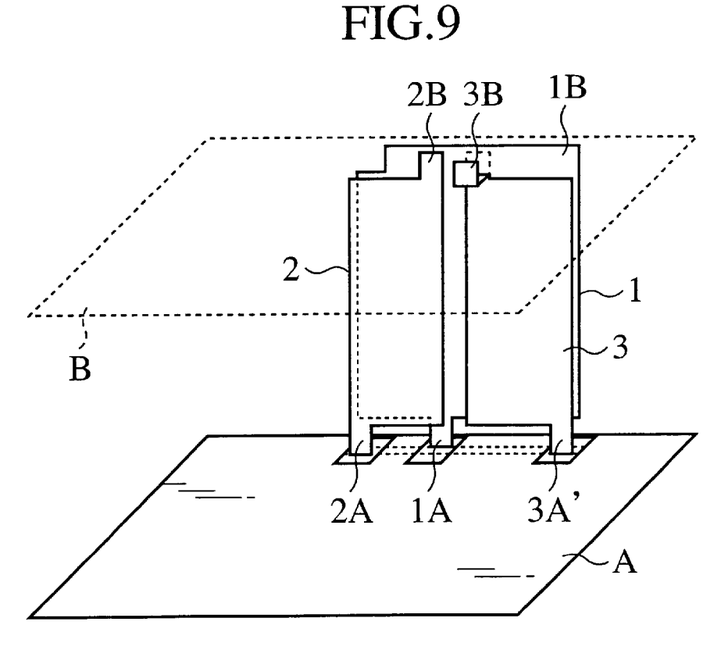
FIG. 9 is a perspective view showing yet another embodiment of the present invention.

In the case in which opposing currents flow in the planar interconnects 2 and 3, it is possible to achieve the effect of reducing the mutual inductance by virtue of eddy currents flowing in the planar interconnect 1. Additionally, and universally applicable to other embodiments as well, although it is advantageous from the standpoint of mounting to have no interference between connection terminals aligned on one side of an interconnect, it is alternately possible, as shown in FIG. 9, to have a connection terminal 1A or 1B (1B in the case of this drawing) have a large width in making connection to a circuit board. This is an effective approach in a case in which the it is desirable to reduce the interconnection inductance, such as in a case in which the planar interconnect 1 is a ground line. Although the width of the connection terminal 1B in FIG. 9 is shown as being slightly smaller than the length of the upper side of the planar interconnect, it can alternatively be made the same as the width of the planar interconnect. Although not shown in the drawing, it is possible to have both the connection terminals 1A and 1B make connection to the circuit boards with a large width.

In other words, FIG. 8 as well as in FIG. 9 shows an interconnect structure according to the aspect implemented in FIG. 7, wherein the plurality of layered interconnects includes: a first interconnect 1 of which the four-sided form of the body portion has a first pair of remaining sides (i.e., left and right sides) thereof spaced at a first distance from each other; a second interconnect 2 of which the four-sided form of the body portion has a second pair of remaining sides (i.e., left and right sides) thereof spaced from each other at a second distance smaller than the first distance, the second pair of remaining sides including one remaining side (i.e., the left side) being flush with one (i.e., the left side) of the first pair of remaining sides; and a third interconnect 3 of which the four-sided form of the body portion has a third pair of remaining sides (i.e., left and right sides) spaced from each other at a third distance smaller than the first distance, the third pair of remaining sides including one remaining side (i.e., the right side) being flush with the other (i.e., the right side) of the first pair of remaining sides.

Figure 10:
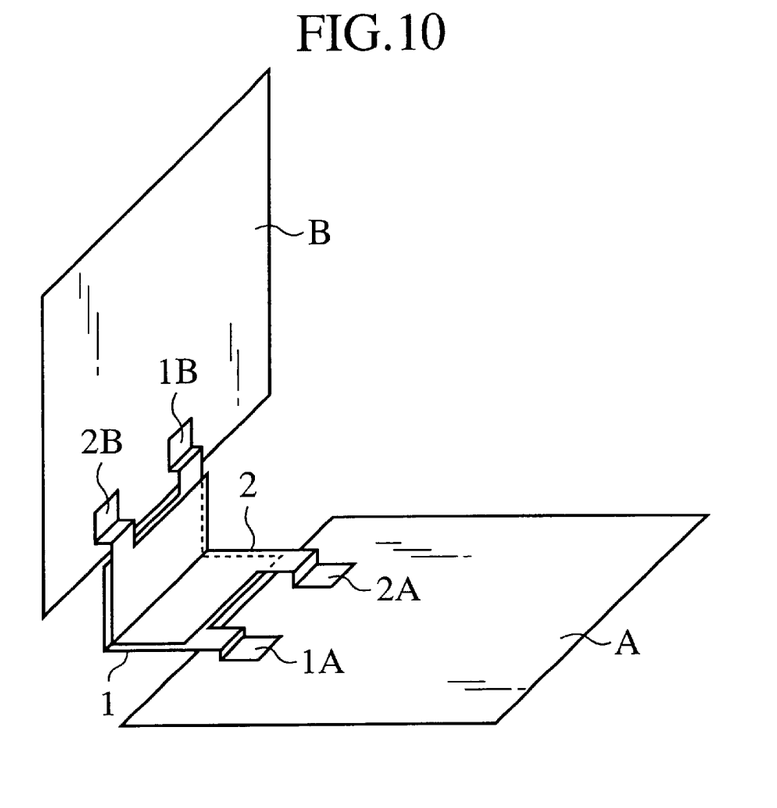
FIG. 10 is a perspective view showing yet another embodiment of the present invention.

It will be understood that that there is no restriction demanding that the two circuit boards A and B be disposed in parallel. For example, as shown in FIG. 10, it is alternatively possible to have an arrangement in which the circuit boards are mutually perpendicular. By providing an L-shaped planar interconnect (having an L shape when viewed from a direction parallel to all planes of the planar interconnect) to make interconnections between these circuits, it is possible to achieve the same type of effects as described for arrangements in which the circuit boards are mutually parallel.

In other words, FIG. 10 shows an interconnect structure according to the aspect implemented in FIG. 7, wherein the four-sided form has a pair of remaining sides (i.e. front and rear sides in the figure) bent at right angles.

Figure 11:
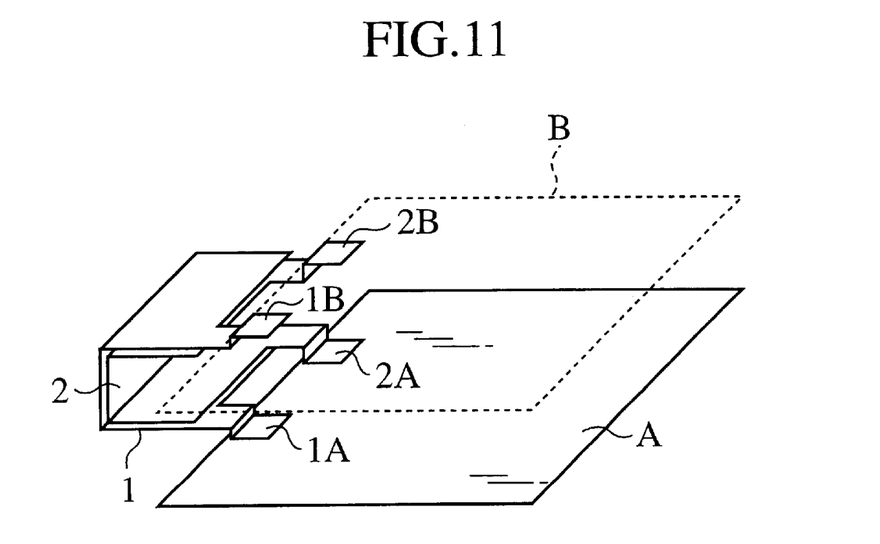
FIG. 11 is a perspective view showing yet another embodiment of the present invention.

In the same manner, in the case of a square U-shaped planar interconnect (having a U-shaped form open on one side when viewed from a direction parallel to all planes of the planar interconnect), as shown in FIG. 11, connection terminals appear arranged laterally along one side of a circuit board, and for a circuit board that in use is inserted into a slot, by adopting a configuration in which interconnections are made between two circuit boards inserted into different slots, it is possible to achieve the same type of effects as described for other arrangements of circuit boards.

In other words, FIG. 11 shows an interconnect structure according to the aspect implemented in FIG. 7, wherein the four-sided form has a pair of remaining sides (i.e. front and rear sides in the figure) bent at right angles at different locations thereon.

Figure 12:
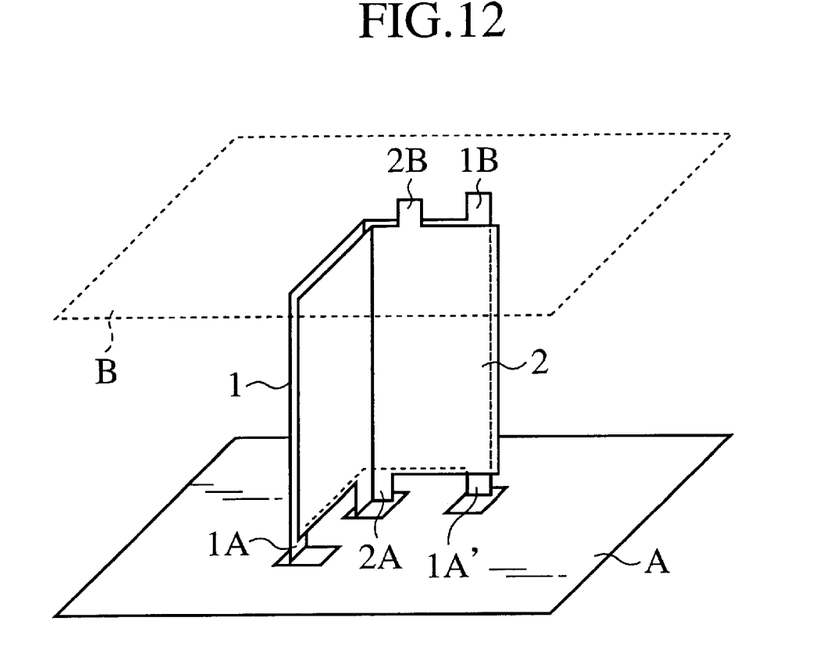
FIG. 12 is a perspective view showing yet another embodiment of the present invention.

Yet another configuration, as illustrated in FIG. 12, is one in which an L-shaped planar interconnect structure as noted above has an L shape when viewed from a direction that is perpendicular to mutually parallel circuit boards A and B, in which case, because the planar interconnect structure stands independently on the circuit board A, mounting by soldering or the like is facilitated. In the case in which two circuit boards are parallel, if the L-shaped planar interconnect structure is either provided near the center of gravity of the upper circuit board B or provided at two locations thereon, it is possible to support the upper circuit board B using the planar interconnect structure itself. The above-noted two locations can be at diagonally opposing positions of the circuit board and, of course, it is possible to dispose this structure at three or even four corners of the circuit board.

In other words, FIG. 12 shows an interconnect structure according to the aspect implemented in FIG. 7, wherein the four-sided form has the pair of opposing sides (i.e. top and bottom in the figure) bent at right angles.

Figure 13:
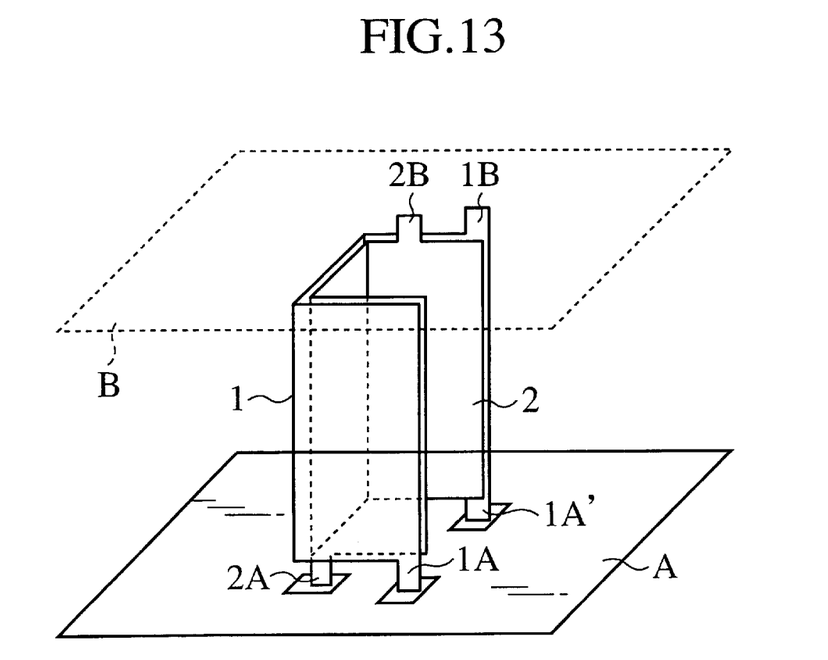
FIG. 13 is a perspective view showing yet another embodiment of the present invention.

Yet another alternative configuration, as shown in FIG. 13, is one using a U-shaped form, with the planar interconnect appearing to have a square channel when viewed from a direction perpendicular to the circuit boards A and B. In other words, FIG. 13 shows an interconnect structure according to the aspect implemented in FIG. 7, wherein the four-sided form has the pair of opposing sides (i.e. top and bottom in the figure) bent at right angles at different locations thereon.

Figure 14:
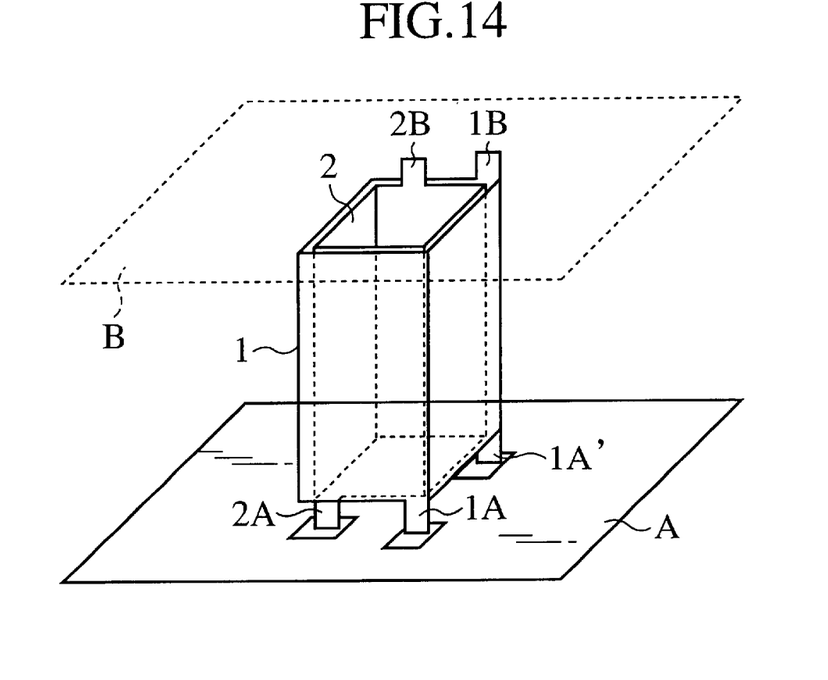
FIG. 14 is a perspective view showing yet another embodiment of the present invention.
Figure 15:
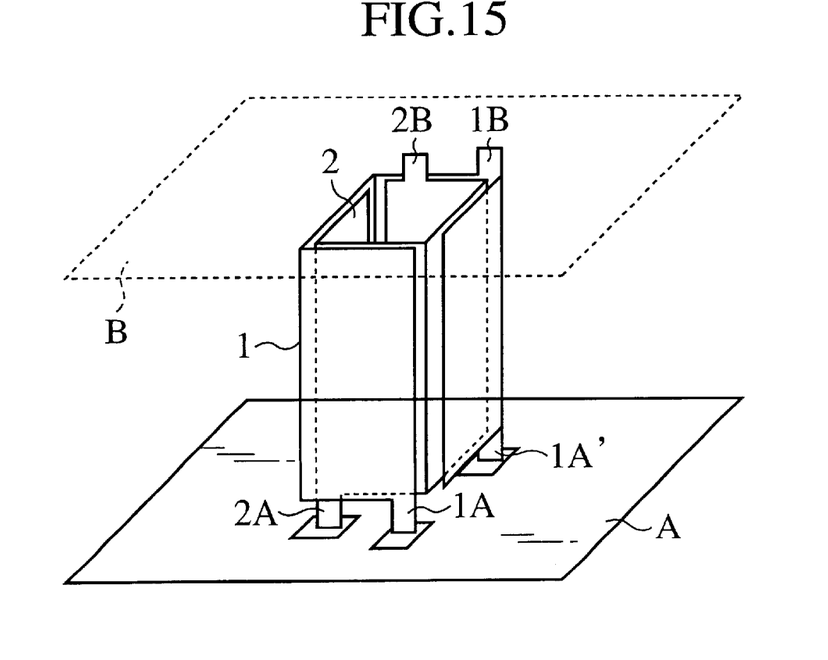
FIG. 15 is a perspective view showing yet another embodiment of the present invention.
Figure 16:
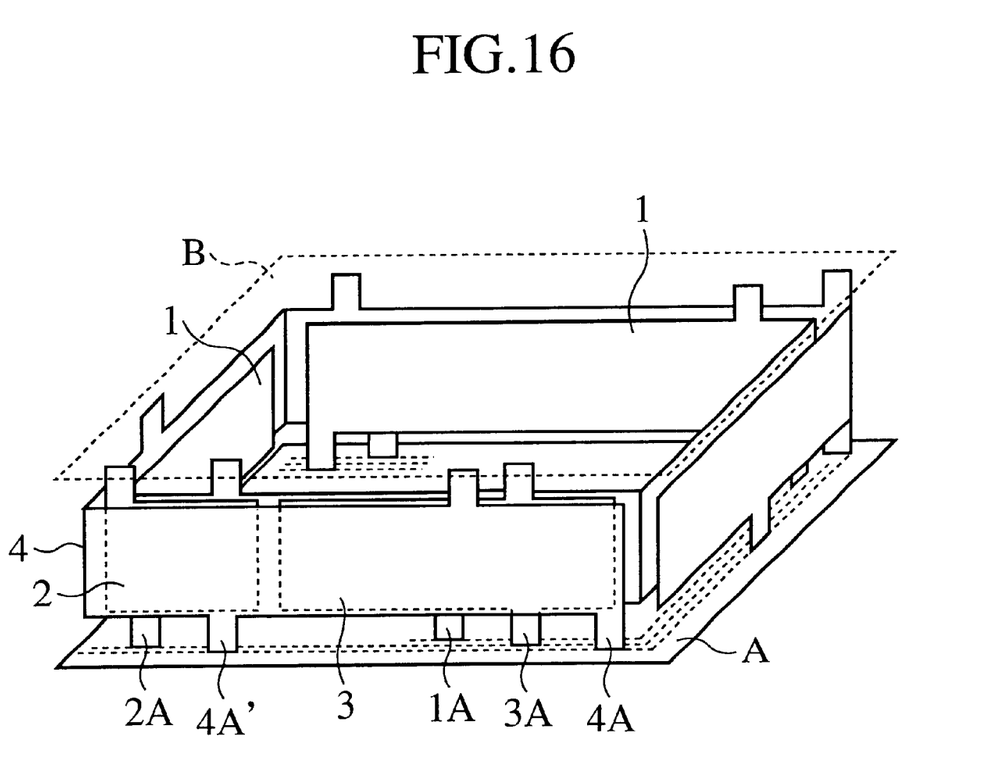
FIG. 16 is a perspective view showing yet another embodiment of the present invention.

Another possible configuration, as shown in FIG. 14, is one in which a planar interconnect has a tubular shape (either cylindrical or square), and yet another is one, as shown in FIG. 15, in which a nearly tubular structure not having an annular structure and having an open end is used. In the case of a tubular shape or a tubular shape with an open end, if this structure is used, for example, for a power supply line and a ground line and the configuration is arranged so that it surrounds the periphery of the circuit board, because the overall configuration has a box shape, immunity is achieved on the power supply with respect to externally introduced electromagnetic noise, it is possible to suppress the generation of noise to the outside, and it is further possible to achieve a great improvement in the degree of freedom in designing the power supply line on the circuit board. One example of this is shown in FIG. 16. In FIG. 16, the reference numerals 2 and 3, similar to the case shown in FIG. 8, denote two planar interconnects inserted in an arrangement so that there is no crossing of currents therein. Additionally, in this configuration, if necessary it is possible to have partial interconnects interposed between the two circuit boards. If this is done, there are relatively few jumper wires on the circuit boards, making it possible to supply electrical power with at a low impedance.

In other words, FIG. 14 shows an interconnect structure according to the aspect implemented in FIG. 7, wherein the four-sided form has the pair of opposing sides each respectively deformed into a polygonal enclosing form, which is close. FIG. 15 shows an interconnect structure according to the aspect implemented in FIG. 7, wherein the four-sided form has the pair of opposing sides each respectively deformed into a polygonal enclosing form, which is open. FIG. 16 shows an interconnect structure according to the aspect implemented in FIG. 7, wherein the plurality of layered interconnects are configured to be cooperative to define an polygonal enclosing form.

As will be seen from the foregoing embodiments, the present invention has various aspects to be noted.

More specifically, among such aspects, a first aspect of the present invention is an interconnect structure having a plurality of planar interconnects interposed with a prescribed distance therebetween, each planar interconnect having at least two connection terminals, and each planar interconnect having at least two sets of sides capable of existing in one and the same plane in mutual proximal opposition. The configuration of this aspect of the present invention corresponds to that shown in FIG. 1 of the accompanying drawings, which is described below. Taking the example shown in FIG. 1, one set of sides that can exist in one and the same plane are the upper side of the planar interconnect 1 and the upper side of the planar interconnect 2 in FIG. 1, and similarly, another set of sides that can exist in one and the same plane are the lower sides of the planar interconnect 1 and the planar interconnect 2 of FIG. 1, making a total of two sets of such sides. The above-used phrase "in one and the same plane" refers, for example, to the two lower sides of the two planar interconnects facing the circuit board A, and the upper sides thereof facing the circuit board B. The term planar interconnect shall not be construed herein to be restricted to a flat planar shape, and shall encompass, for example, a shape formed by truncating a cylindrical shape with a plane parallel to the center axis of the cylinder.

By adopting the above-described configuration, in which planar interconnects having a relatively large surface area are used instead of rigid wires to make interconnection between two layers of circuit boards, there is an increase in the capacitance formed between interconnects, thereby enhancing the function of filtering out high-frequency noise.

Another aspect of the present invention is a variation on the first aspect, wherein a straight line joining one connection terminal existing at a side belonging to one of two sets of sides in one planar interconnect of the plurality of planar interconnects and a straight line joining one connection terminal existing at a side belonging to one of two sets of sides in another of the plurality of planar interconnects intersect when viewed from a direction perpendicular to a main surface of the plurality of planar interconnects. The configuration of this aspect of the present invention corresponds to that shown, by way of example, in FIG. 3, which is described below. In the example shown in FIG. 3, the straight line joining the connection terminals 1A and 1B of the planar interconnect 1 and the straight line joining the connection terminals 2A and 2B of the planar interconnect 2 appear to intersect one another when viewed from a direction that is perpendicular to the surfaces of the planar interconnects 1 and 2, this being from the direction of the viewer of the drawing. This means that a current path joining the lower right connection terminal 2A and the upper left connection terminal is formed by the planar interconnect 1 and a current path joining the lower left connection terminal 1A and the upper right connection terminal 1B is formed by the planar interconnect 2.

According to the configuration described above, it is possible to arbitrarily establish the alignment sequence of interconnects between a first and second layer circuit board. For example, this greatly facilitates the crossing of interconnects between the first and second layer of circuit board. Additionally, there is a degree of freedom achieved in establishing the placement of connection locations on the first and second layer circuit boards. By using planar interconnects, it is possible to tolerate a slight amount of positional shift, necessitated by the conditions of the two circuit boards. Additionally, although there are parts of the circuitry such as a power supply line, which must be multiply branched from a single interconnect, and locations at which a large number of interconnects must be consolidated at a smaller number of connection terminals, when such conditions arise between a first-layer and second-layer circuit board, this branching structure can be achieved by application of the interconnection structure provided by the present invention. That is, application of the present invention simplifies circuit board interconnections and enables effective use of circuit board real estate, while enabling a reduction in the interconnection impedance formed on the circuit boards. Additionally, in the case in which two arbitrary planar interconnects of the plurality of planar interconnects are used as a signal current path and a return path therefor, by causing the current within the two planar interconnects to flow in intersecting directions, there is a reduction in the mutual inductance therebetween, thereby providing suppression of signal delay and waveform deterioration. Another effect of this aspect of the present invention is that, by providing connection to only the first layer of circuit board at part of a planar interconnect, it is possible to make active use of the noise filtering effect of this structure.

A third aspect of the present invention is a variation on either the first aspect or the second aspect, wherein there are three or more planar interconnects, of which at least two are electrically connected, and of which at least one planar interconnect is interposed between other planar interconnects. The configuration of this aspect of the present invention corresponds, for example, to those shown in FIG. 4 and FIG. 7, which are described below.

According to the above-described configuration, in a case in which the two planar interconnects are connected to a ground line or a power supply line and the planar interconnect interposed therebetween is a signal line, it is possible to protect the signal line from the introduction of external electromagnetic noise, and also to suppress the generation of electromagnetic noise from the signal line.

A fourth aspect of the present invention is a variation on either the first or the second aspect, wherein there are a second and a third planar interconnect adjacent to a main surface of a first planar interconnect. The configuration of this aspect of the present invention corresponds, for example, to that shown in FIG. 8, to be described below. Taking the example shown in FIG. 8, the planar interconnects 2 and 3 are disposed in a row in one and the same plane facing the planar interconnect 1.

According to the above-described fourth aspect of the present invention, in the case in which the current paths of the second planar interconnect and the third planar interconnect do not spatially interfere with one another (that is, in the case in which the current paths do not cross one another), the adoption of this configuration can be done to limit the overall thickness of the interconnection structure. Additionally, in this case the mutual inductance between the second interconnect and the third interconnect is reduced by the effect of eddy currents generated in the first interconnect.

A fifth aspect of the present invention is a variation on any one of the first to the fourth aspects, wherein one or all of the planar interconnects has an L shape, a square channel shape, a tubular shape, or a tubular shape having an open end. Examples of an L-shaped planar interconnect are shown in FIG. 10 and FIG. 12, examples of a square channel planar interconnect are shown in FIG. 11 and FIG. 13, and an example of a open-ended tubular shape is shown in FIG. 15. The tubular shape having an open end need not be a completely closed tube, but rather can have a partial opening. It will be understood that the tubular shape referred to above encompasses both a round cylindrical shape and a rectangular tubular shape.

According to the fifth aspect of the present invention, the interconnect structure itself provides support for the circuit boards it connects, thereby enhancing the degree of freedom in designing the overall apparatus.

A sixth aspect of the present invention is a variation on any one of the first to the fifth aspects, wherein a high dielectric substance is interposed between a plurality of planar interconnects. This configuration is described below with reference made to, for example, FIG. 1 and FIG. 6.

According to the sixth aspect of the present invention, interposing a high dielectric substance between planar interconnects not only facilitates insulation between a plurality of planar interconnects, but also increases the line-to-line capacitances, thereby further enhancing the noise filtering effect.

The contents of Japanese Patent Application No. 2000-282945 are incorporated herein by reference.

While preferred embodiments of the present invention have been described using specific terms, such description is for illustrative purposes, and it is to be understood that changes and variations may be made without departing from the spirit or scope of the following claims.

What is claimed is:

1. An interconnect structure comprising:
a pair of first and second interconnects configured to have a reduced inductance, wherein the first interconnect comprises:
a first planer conductive body portion in a four-sided form having a first side, a second side, a third side opposing the first side, and a fourth side, the first side crossing the second side, with a first vertex therebetween, the third side crossing the second side, with a second vertex therebetween;
a first connecting portion formed on the first side, in a vicinity of the first vertex; and
a second connecting portion formed on the third side, in a vicinity of the second vertex; and
the second interconnect comprises:
a second planer conductive body portion in a four-sided form, said second planer conductive body portion being proximate to and parallel with the first planer conductive body portion and having a fifth side, a sixth side parallel to the second side, a seventh side opposing the fifth side, and an eighth side, the fifth side crossing the eighth side, with a third vertex therebetween, the seventh side crossing the eighth side, with a fourth vertex therebetween;
a third connecting portion formed on the fifth side, in a vicinity of the third vertex; and
a fourth connecting portion formed on the seventh side, in a vicinity of the fourth vertex.

2. An interconnect structure according to claim 1, further comprising a fifth connecting portion configured on one of the first side, the third side, the fifth side, and the seventh side.

3. An interconnect structure according to claim 1, further comprising a third interconnect comprising:
a body portion configured as a third planer conductor with a third plane close and parallel to one of the first and second planes, in a four-sided form having a ninth side, a tenth side parallel to the second side, an eleventh side opposing the ninth side, and a twelfth side, the ninth side crossing the tenth side, with a fifth vertex therebetween, the eleventh side crossing the twelfth side, with a sixth vertex therebetween;
a fifth connecting portion configured on the ninth side, in a vicinity of the fifth vertex; and
a sixth connecting portion configured on the eleventh side, in a vicinity of the sixth vertex.

4. An interconnect structure according to claim 1, further comprising a fifth connecting portion configured on one of the second side and the fourth side.

5. An interconnect structure according to claim 1, wherein the first and second interconnects are configured to conduct current in mutually opposite directions.

6. An interconnect structure comprising:
a pair of first and second interconnects configured to have a reduced inductance, wherein the first interconnect comprises:
a first planer conductor body portion having a first side, a second side, a third side opposing the first side, and a fourth side, the first side crossing the fourth side, with a first vertex therebetween, the third side crossing the second side, with a second vertex therebetween;
a first connecting portion formed on the first side, in a vicinity of the first vertex; and
a second connecting portion formed on the third side, in a vicinity of the second vertex; and
the second interconnect comprises:
a second planer conductor body portion proximate to and parallel with the first planer conductor body portion and having a fifth side, a sixth side parallel to the second side, a seventh side opposing the fifth side, and an eighth side, the fifth side crossing the sixth side, with a third vertex therebetween, the seventh side crossing the eighth side, with a fourth vertex therebetween;
a third connecting portion formed on the fifth side, in a vicinity of the third vertex; and
a fourth connecting portion formed on the seventh side, in a vicinity of the fourth vertex.

7. An interconnect structure according to claim 6, further comprising a fifth connecting portion configured on one of the first side, the third side, the fifth side, and the seventh side.

8. An interconnect structure according to claim 6, further comprising a third interconnect comprising:

a body portion configured as a third planer conductor with a third plane close and parallel to one of the first and second planes, in a four-sided form having a ninth side, a tenth side parallel to the second side, an eleventh side opposing the ninth side, and a twelfth side, the ninth side crossing the twelfth side, with a fifth vertex therebetween, the eleventh side crossing the twelfth side, with a sixth vertex therebetween;

a fifth connecting portion configured on the ninth side, in a vicinity of the fifth vertex; and a sixth connecting portion configured on the eleventh side, in a vicinity of the sixth vertex.

9. An interconnect structure according to claim 6, further comprising a fifth connecting portion configured on one of the second side and the fourth side.

10. An interconnect structure according to claim 6, wherein the first and second interconnects are configured to conduct current in mutually opposite directions.

11. An interconnect structure comprising a plurality of layered interconnects having mutually flush sides configured to have a reduced inductance, the plurality of layered interconnects each respectively comprising:

a planer conductor body portion having a pair of planes, formed in a four-sided form having a pair of opposing sides; and a pair of connecting portions with respective connecting portions of said pair of connecting portions formed on opposing sides of said pair of planes, wherein the plurality of layered interconnects includes:

a first interconnect of which the four-sided form of the body portion has a first pair of remaining sides thereof spaced at a first distance from each a second interconnect of which the four-sided form of the body portion has a second pair of remaining sides thereof spaced from each other at a second distance smaller than the first distance, the second pair of remaining sides including one remaining side being flush with one of the first pair of remaining sides; and a third interconnect of which the four-sided form of the body portion has a third pair of remaining sides thereof spaced from each other at a third distance smaller than the first distance, the third pair of remaining sides including one remaining side being flush with the other of the first pair or remaining sides.

12. An interconnect structure according to claim 11, wherein the four-sided form has a pair of remaining sides bent at right angels.

13. An interconnect structure according to claim 11, wherein the four-sided form has a pair of remaining sides bent at right angles at different locations thereon.

14. An interconnect structure according to claim 11, wherein the four-sided form has the pair of opposing sides bent at right angles.

15. An interconnect structure according to claim 11 wherein the four-sided form has the pair of opposing sides bent at right angles at different locations thereon.

16. An interconnect structure according to claim 11, wherein the plurality of layered interconnects are configured to be cooperative to define an enclosing form.

17. An interconnect structure according to claim 11, wherein the four-sided form has the pair of opposing sides each respectively deformed into an enclosing form.

18. An interconnect structure according to claim 17, wherein the enclosing form is closed.

19. An interconnect structure according to claim 17, wherein the enclosing form is open.

* * * * *